United States Patent
Hsieh et al.

(10) Patent No.: US 9,202,860 B2
(45) Date of Patent: Dec. 1, 2015

(54) METHOD FOR FABRICATING CAPACITOR HAVING RUTILE TITANIUM OXIDE DIELECTRIC FILM

(71) Applicant: NANYA TECHNOLOGY CORP., Tao-Yuan Hsien (TW)

(72) Inventors: Chun-I Hsieh, Taoyuan County (TW); Vishwanath Bhat, Boise, ID (US)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 0 days.

(21) Appl. No.: 14/147,603

(22) Filed: Jan. 6, 2014

(65) Prior Publication Data
US 2014/0134821 A1    May 15, 2014

Related U.S. Application Data

(63) Continuation of application No. 13/674,929, filed on Nov. 12, 2012, now abandoned.

(51) Int. Cl.
*H01L 49/02* (2006.01)
*H01L 21/02* (2006.01)
*C23C 16/40* (2006.01)
*C23C 16/455* (2006.01)

(52) U.S. Cl.
CPC .............. *H01L 28/60* (2013.01); *C23C 16/405* (2013.01); *C23C 16/45527* (2013.01); *H01L 21/0228* (2013.01); *H01L 21/02186* (2013.01); *H01L 28/40* (2013.01)

(58) Field of Classification Search
CPC ... H01L 28/40; H01L 28/60; H01L 21/02186; H01L 21/0228
USPC .......................................................... 438/381
See application file for complete search history.

(56) References Cited

U.S. PATENT DOCUMENTS

| 7,968,452 | B2 | 6/2011 | Chen | |
| 2009/0065896 | A1 | 3/2009 | Hwang | |
| 2009/0134445 | A1* | 5/2009 | Park et al. | 257/316 |
| 2010/0210082 | A1* | 8/2010 | Nakamura | 438/253 |
| 2010/0330269 | A1* | 12/2010 | Chen et al. | 427/123 |

* cited by examiner

*Primary Examiner* — Eva Y Montalvo
*Assistant Examiner* — Nga Doan
(74) *Attorney, Agent, or Firm* — Winston Hsu; Scott Margo

(57) ABSTRACT

A method for fabricating a capacitor includes: (1) forming a bottom electrode on a substrate; (2) forming a template layer on the bottom electrode; (3) performing a plurality of atomic layer deposition (ALD) cycles by using water vapor as an oxidant thereby depositing a first TiO2 layer on the template layer; and (4) performing ozone pulse and purge step to transform entire thickness of the first TiO2 layer into rutile phase.

7 Claims, 4 Drawing Sheets

METHOD FOR FABRICATING CAPACITOR HAVING RUTILE TITANIUM OXIDE DIELECTRIC FILM

CROSS REFERENCE TO RELATED APPLICATIONS

This is a continuation of U.S. application Ser. No. 13/674,929 filed Nov. 12, 2012, which is incorporated herein in its entirety by reference.

BACKGROUND OF THE INVENTION

1. Field of the Invention

The present invention relates to a method of forming a high-k dielectric layer and a capacitor structure having such high-k dielectric layer.

2. Description of the Prior Art

As known in the art, downscaling of the metal-insulator-metal capacitor for dynamic random access memory (DRAM) devices has required the introduction of high permittivity dielectrics, for example, titanium oxide (TiO2). It is well known that titanium oxide has multiple phases which have different dielectric constants. Two known phases of titanium oxide are anatase and rutile. It is often desirable to increase rutile TiO2 in the capacitor dielectric film because it has a much higher dielectric constant (k>90) than anatase TiO2.

Typically, TiO2 dielectric layer is deposited by using an atomic layer deposition (ALD) method. However, TiO2 is inherently formed in the anatase phase during the ALD process. To form a TiO2 dielectric layer with the rutile phase and low leakage as well, methods such as impurity doping, post annealing (600° C. or higher) and/or ozone-based ALD in combination with template layers are employed. However, the impurity doping method has problems such as high cost, low throughput and is hard to control. The drawback of the post annealing method is the additional thermal budget and mechanical stress, which may seriously degrade the MOS devices. The problems of the ozone-based ALD/template layer method include low deposition rate (~0.4 Å per ALD cycle) and the risk of etching or oxidizing the underlying layer.

Water-based ALD method, which uses water vapor as oxidant in the ALD cycles, is also employed to deposit the TiO2 dielectric layer. The water-based ALD method has a much higher deposition rate than the ozone-based ALD method, meaning higher throughput. However, TiO2 deposited using the water-based ALD method is inherently in the anatase phase. To form rutile TiO2 in the water-based ALD process, a 10 nm thick TiO2 film or a relatively higher process temperature is typically required.

There is a need in this industry to provide an improved method for depositing a high-k dielectric material such as rutile TiO2 with a higher deposition/growth rate and a low leakage and without introducing the aforesaid prior art shortcomings.

SUMMARY OF THE INVENTION

According to one aspect, the invention provides a capacitor structure including a first electrode on a substrate; a template layer on the first electrode; a titanium oxide (TiO2) dielectric layer on the template layer, wherein the TiO2 dielectric layer has substantially only rutile phase; and a second electrode on the TiO2 dielectric layer. The TiO2 dielectric layer is formed by using a modified water-based ALD process. The method for fabricating the capacitor includes: (1) forming a bottom electrode on a substrate; (2) forming a template layer on the bottom electrode; (3) performing a plurality of atomic layer deposition (ALD) cycles by using water vapor as an oxidant thereby depositing a first TiO2 layer on the template layer; and (4) performing ozone pulse and purge step to transform entire thickness of the first TiO2 layer into rutile phase.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
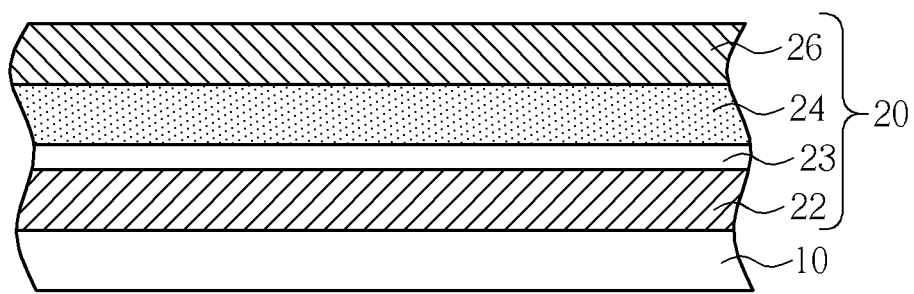
FIG. 1 is a cross-sectional diagram showing a portion of a capacitor structure according to one embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

FIG. 1 is a cross-sectional diagram showing a portion of a capacitor structure according to one embodiment of this invention. As shown in FIG. 1, the capacitor structure 20 is disposed on a substrate 10 such as a silicon-based substrate. However, it is understood that the substrate 10 may be any appropriate semiconductor substrate. The capacitor structure 20 comprises a first electrode 22 on the substrate, a template layer 23 on the first electrode 22, a high-k dielectric layer 24 on the template layer 23, and a second electrode 26 on the high-k dielectric layer 24. The first electrode 22 may be a noble material such as ruthenium (Ru). The template layer 23 may comprise Ru, RuO2, Ir, or IrO2. The first electrode 22 may be deposited using any appropriate techniques such as chemical vapor deposition (CVD), ALD, physical vapor deposition (PVD), or sputtering. The second electrode 26 may be a novel metal or any suitable conductive material such as metal oxide or metal nitride. For example, the second electrode 26 may be Ru, Pt or Ir, RuO2, IrO2, TiN, TaN, WN or the like.

According to this embodiment, the high-k dielectric layer 24 that is directly deposited onto the template layer 23 is rutile TiO2. According to this embodiment, substantially, the high-k dielectric layer 24 has only one single phase: rutile. That is, the high-k dielectric layer 24 has substantially no x-ray diffraction peak associated with anatase TiO2. According to this embodiment, the thickness of the high-k dielectric layer 24 is about 8 nm or thinner. According to this embodiment, no impurity such as aluminum (Al) is doped into the high-k dielectric layer 24.

Figure 2:
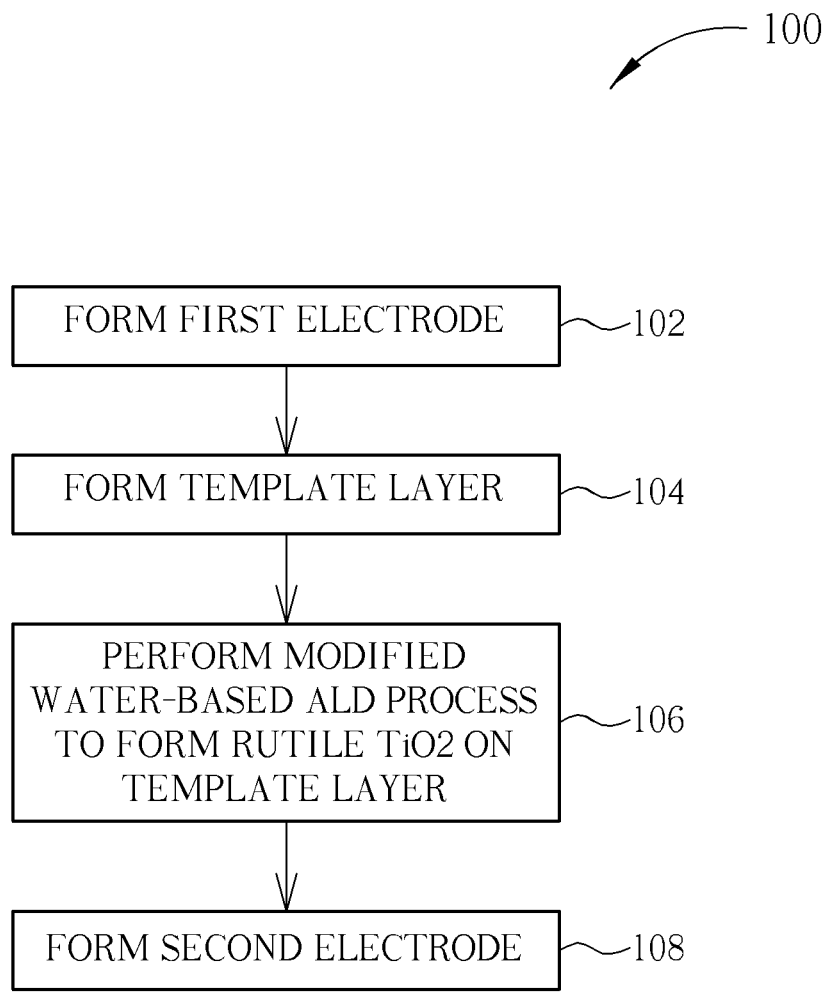
FIG. 2 is a flow chart illustrating an exemplary process of forming the capacitor structure as set forth in FIG. 1 according to this invention.
Figure 3:
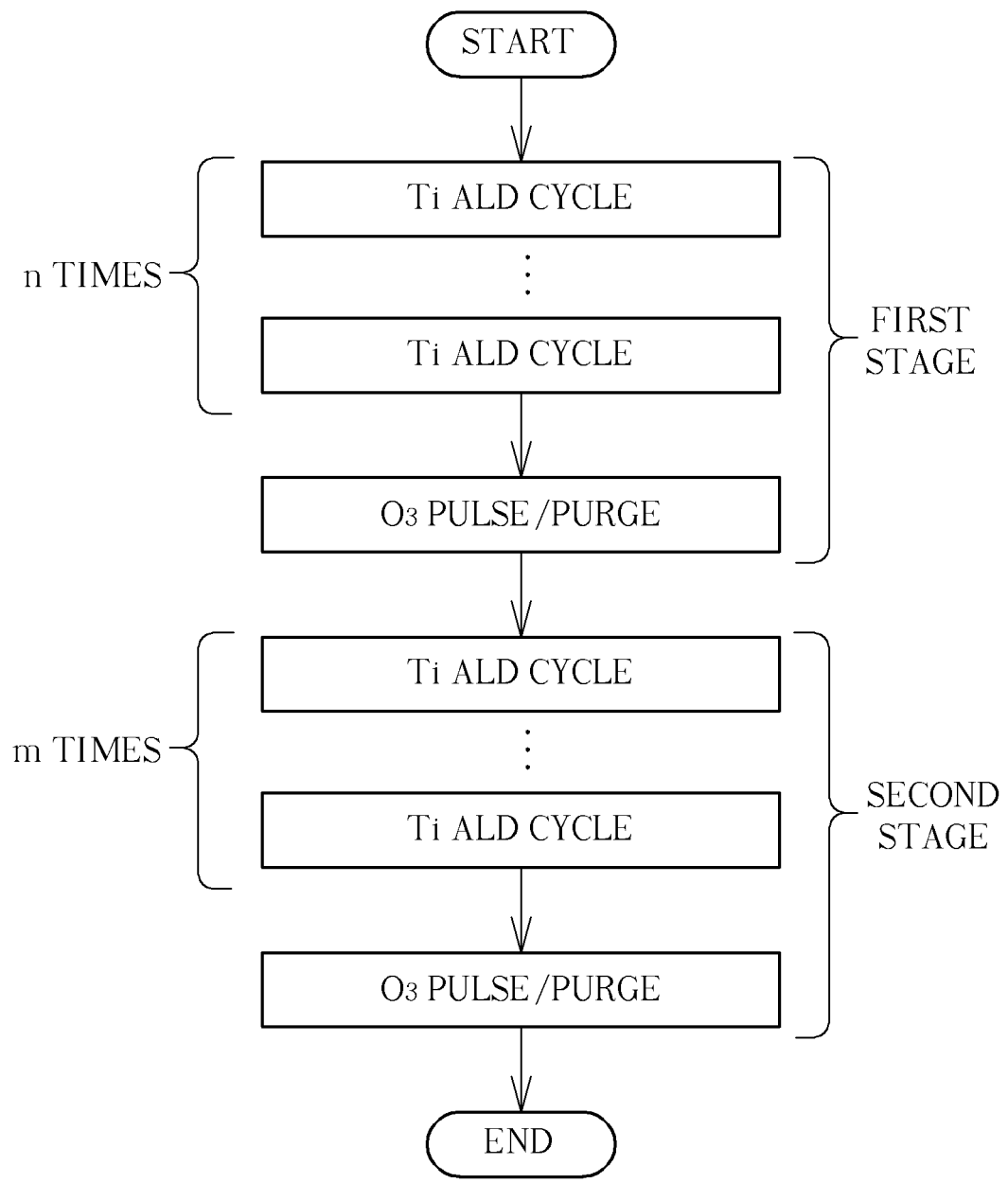
FIG. 3 is a flow chart illustrating an exemplary modified water-based ALD process.

Referring now to FIG. 2 and FIG. 3, and briefly to FIG. 1, wherein FIG. 2 is a flow chart illustrating an exemplary process of forming the capacitor structure 20 as set forth in FIG. 1 according to this invention, and FIG. 3 is a flowchart illustrating an exemplary modified water-based ALD process. As shown in FIG. 2, the process flow 100 includes four sequential major steps 102~108. In Step 102, the first electrode 22 such as Ru is deposited onto the substrate 10. In Step 104, the template layer 23 is formed on the first electrode 22. Subsequently, in Step 106, a modified water-based ALD process is performed to deposit a rutile TiO2 layer 24 on the template layer 23. According to this embodiment, the thickness of the rutile TiO2 layer 24 may be about 8 nm or thinner. Finally, in Step 108, the second electrode 26 is formed on the rutile TiO2 layer 24. No post anneal or post thermal treatment is required between Step 10.

According to this embodiment, the aforesaid modified water-based ALD process comprises a plurality of Ti ALD cycles, and each ALD cycle comprises, in the order of: (1) supplying a Ti precursor into a reaction chamber (Ti pulse); (2) purging the reaction chamber with inert gas; (3) supplying water vapor into the reaction chamber (H2O pulse); and (4) purging the reaction chamber with inert gas. According to this embodiment, the process temperature may range between 150° C. and 450° C., for example, 285° C. When the Ti precursor such as TiCl4 is supplied into the reaction chamber, a portion of the Ti precursor is adsorbed onto an exposed surface of the substrate 10. The purge gas such as argon or nitrogen then removes the rest of the Ti precursor that is not adsorbed. The water vapor that acts as an oxidant supplied to the substrate 10 then reacts with the adsorbed Ti precursor to form a single atomic TiO2 layer on the substrate 10.

As shown in FIG. 3, the aforesaid modified water-based ALD process may comprise multiple stages according to one embodiment. In the first stage, for example, the aforesaid ALD cycle may be repeated n times to initially deposit a first TiO2 layer on the template layer 23. For example, n is an integer ranging between 5 and 80 inclusive. The initially deposited first TiO2 layer on the template layer 23 may be anatase TiO2. The first stage is ended by performing an ozone pulse and purge step that substantially transfer the entire thickness of the initially deposited first TiO2 layer on the template layer 23 into rutile TiO2. The duration of the ozone pulse may be greater than 5 seconds. In the second stage, for example, the aforesaid ALD cycle may be repeated m times to initially deposit a second TiO2 layer on the rutile TiO2. For example, m is an integer ranging between 5 and 80 inclusive, and wherein n may be not equal to m. The second stage is also ended by performing an ozone pulse and purge step that substantially transfer the entire thickness of the second TiO2 layer into rutile TiO2. According to one embodiment, the Ti ALD cycle to O3 pulse/purge ratio may range between 80:1 and 5:1.

Figures 4, 5:
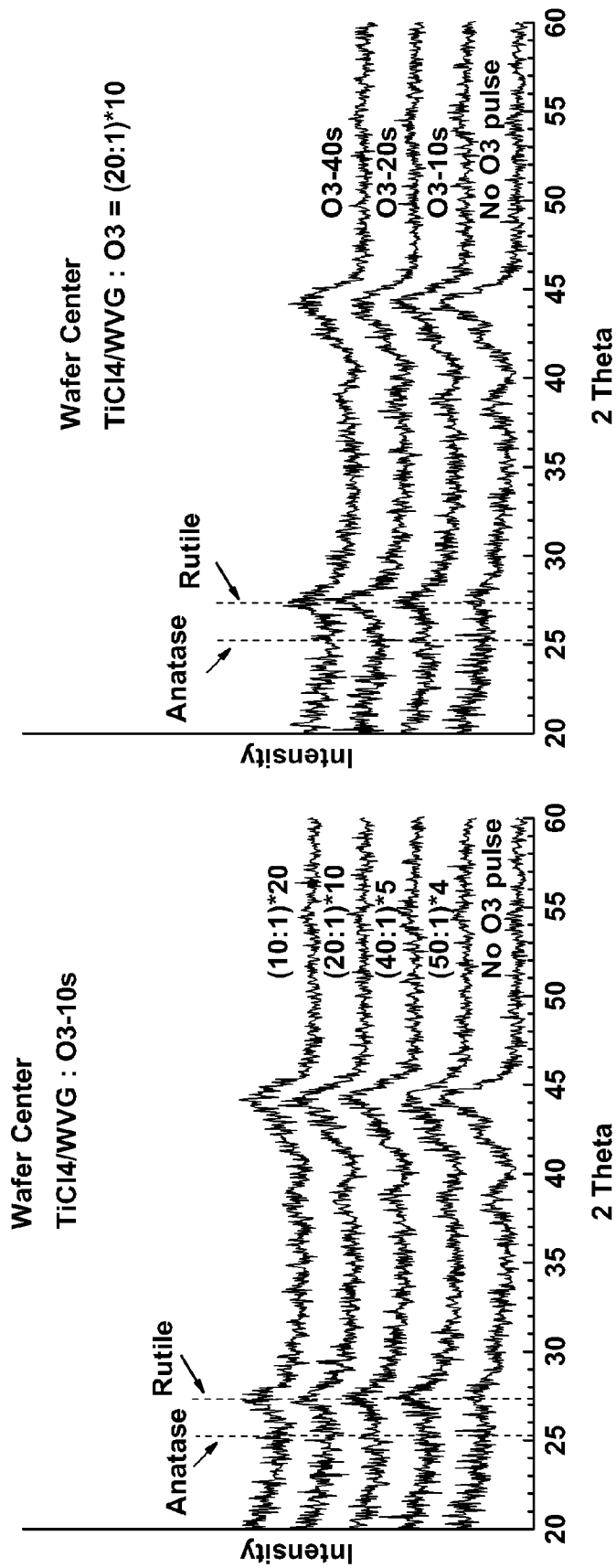
FIG. 4 shows the X-ray diffraction spectrum of the modified water-based ALD TiO2 layer (relative intensity as a function of 2 theta) in the spectral region between 2 theta=20 and 2 theta=60.
FIG. 5 shows the X-ray diffraction spectrum of the modified water-based ALD TiO2 layer formed by using O3 pulse/purge ratio of 20:1 and different duration of O3 pulse.

FIG. 4 shows the X-ray diffraction spectrum of the modified water-based ALD TiO2 layer (relative intensity as a function of 2 theta) in the spectral region between 2 theta=20 and 2 theta=60. As shown in FIG. 4, the TiO2 layers formed by using various O3 pulse/purge ratio ranging between 50:1 and 10:1 have obvious peak at 2 theta=27 and this indicate that the intervening O3 pulse helps rutile TiO2 crystallization. FIG. 4 also shows the result of without adding O3 pulse wherein the 8 nm water-based ALD TiO2 layer is amorphous. FIG. 5 shows the X-ray diffraction spectrum of the modified water-based ALD TiO2 layer formed by using O3 pulse/purge ratio of 20:1 and different duration of O3 pulse (10 seconds, 20 seconds and 40 seconds).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a capacitor, comprising:
forming a bottom electrode on a substrate;
forming a template layer on the bottom electrode;
performing a first atomic layer deposition (ALD) stage including a plurality of ALD cycles by using water vapor as an oxidant thereby depositing a first anatase $TiO_2$ layer on the template layer;
performing ozone pulse and purge step to transform entire thickness of the first anatase $TiO_2$ layer into rutile phase, thereby forming a first rutile $TiO_2$ layer;
after performing said ozone pulse and purge step to transform entire thickness of the first anatase $TiO_2$ layer into rutile phase, performing a second ALD stage including a plurality of said ALD cycles thereby depositing a second anatase $TiO_2$ layer on the first rutile $TiO_2$ layer; and
performing ozone pulse and purge step to transform entire thickness of the second anatase $TiO_2$ layer into rutile phase, thereby forming a second rutile $TiO_2$ layer on the first rutile $TiO_2$ layer.

2. The method for fabricating a capacitor according to claim 1 wherein the ALD cycle is repeated n times to deposit the first anatase $TiO_2$ layer.

3. The method for fabricating a capacitor according to claim 2 wherein n is an integer ranging between 5 and 80 inclusive.

4. The method for fabricating a capacitor according to claim 1 wherein the ALD cycle is repeated m times to deposit the second anatase $TiO_2$ layer.

5. The method for fabricating a capacitor according to claim 4 wherein m is an integer ranging between 5 and 80 inclusive.

6. The method for fabricating a capacitor according to claim 1 wherein each of said ALD cycles comprises, in the order of: (1) supplying a Ti precursor into a reaction chamber (Ti pulse); (2) purging the reaction chamber with inert gas; (3) supplying said water vapor into the reaction chamber ($H_2O$ pulse); and (4) purging the reaction chamber with inert gas.

7. The method for fabricating a capacitor according to claim 6 wherein each of said ALD cycles is carried out at a process temperature ranging between 150° C. and 450° C.

* * * * *